United States Patent
Ke et al.

(10) Patent No.: US 10,867,808 B1
(45) Date of Patent: Dec. 15, 2020

(54) MANUFACTURING METHOD OF CONNECTION STRUCTURE

(71) Applicant: UNITED MICROELECTRONICS CORP., Hsin-Chu (TW)

(72) Inventors: Hsiang-Wen Ke, Kaohsiung (TW); Wei-Chuan Tsai, Changhua County (TW); Li-Han Chen, Tainan (TW); Jin-Yan Chiou, Tainan (TW); Yen-Tsai Yi, Tainan (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 0 days.

(21) Appl. No.: 16/505,720

(22) Filed: Jul. 9, 2019

(51) Int. Cl.
- *H01L 21/321* (2006.01)
- *H01L 27/22* (2006.01)
- *H01L 43/02* (2006.01)
- *H01L 43/12* (2006.01)
- *H01L 21/768* (2006.01)

(52) U.S. Cl.
CPC ...... *H01L 21/3212* (2013.01); *H01L 21/7684* (2013.01); *H01L 21/76805* (2013.01); *H01L 21/76846* (2013.01); *H01L 21/76856* (2013.01); *H01L 21/76871* (2013.01); *H01L 21/76879* (2013.01); *H01L 21/76895* (2013.01); *H01L 27/222* (2013.01); *H01L 43/02* (2013.01); *H01L 43/12* (2013.01)

(58) Field of Classification Search
None
See application file for complete search history.

(56) References Cited

U.S. PATENT DOCUMENTS

| | | | |
|---|---|---|---|
| 6,309,966 B1 | 10/2001 | Govindarajan | |
| 9,169,556 B2* | 10/2015 | Wu | C23C 16/50 |
| 9,564,359 B2* | 2/2017 | Chen | H01L 21/76862 |
| 2017/0053811 A1* | 2/2017 | Fung | C23C 16/045 |

OTHER PUBLICATIONS

Kim, Choon-Hwan, et al. "Pulsed CVD-W Nucleation Layer Using WF6 and B2H6 for Low Resistivity W." Journal of the Electrochemical Society, vol. 156, No. 9, 2009, doi:10.1149/1.3155430. (Year: 2009).*

(Continued)

*Primary Examiner* — J. E. Schoenholtz
(74) *Attorney, Agent, or Firm* — Winston Hsu

(57) ABSTRACT

A manufacturing method of a connection structure includes the following steps. A dielectric layer is formed on conductive structures. Openings are formed in the dielectric layer and expose the conductive structures. A tungsten nucleation layer is conformally formed on the dielectric layer and in the openings. A nitrogen-containing treatment is performed on the tungsten nucleation layer. A deposition process is performed to form a tungsten filling layer on the tungsten nucleation layer. An interfacial layer is formed between the tungsten nucleation layer and the tungsten filling layer by the deposition process. A fluorine concentration of the interfacial layer is higher than that of the tungsten filling layer. A chemical mechanical polishing (CMP) process is performed to remove a part of the tungsten nucleation layer and a part of the tungsten filling layer for forming connection structures. The interfacial layer is removed by the CMP process.

19 Claims, 6 Drawing Sheets

(56) References Cited

OTHER PUBLICATIONS

Kajikawa, "Nucleation of W during Chemical Vapor Deposition from WF6 and SiH4", Japanese Journal of Applied Physics, vol. 43, No. 6B, 2004, pp. 3945-3950, Jun. 29, 2004.
McInerney, "Silane reduced chemical vapor deposition tungsten as a nucleating step in blanket W", Journal of Vacuum Science & Technology B: Microelectronics and Nanometer Structures Processing, Measurement, and Phenomena 11, 734 (1993), May 1993.
Petri, "Nitrogen Effect on Post-Nucleation Tungsten CVD Film Growth", Proceedings of the IEEE 1998 International Interconnect Technology Conference (Cat. No. 98EX102), Jun. 3, 1998.

* cited by examiner

MANUFACTURING METHOD OF CONNECTION STRUCTURE

BACKGROUND OF THE INVENTION

1. Field of the Invention

The present invention relates to a manufacturing method of a connection structure, and more particularly, to a manufacturing method of a connection structure in an opening.

2. Description of the Prior Art

The development of semiconductor integrated circuit technology progresses continuously and circuit designs in products of the new generation become smaller and more complicated than those of the former generation. The amount and the density of the functional devices in each chip region are increased constantly according to the requirements of innovated products, and the size of each device has to become smaller accordingly. However, as each component becomes smaller, some manufacturing problems may become more serious accordingly. For example, a manufacturing process of a present layer may be influenced by a distribution condition of a pre-layer under the present layer, such as a density distribution of components formed by the pre-layer. Accordingly, the related manufacturing processes and/or the structural design have to be further modified for reducing related yield loss.

SUMMARY OF THE INVENTION

A manufacturing method of a connection structure is provided in the present invention. A nitrogen-containing treatment is performed on a tungsten nucleation layer, and an interfacial layer is formed between the tungsten nucleation layer and a tungsten filling layer by a deposition process of the tungsten filling layer. The interfacial layer is removed by a chemical mechanical polishing process for forming connection structures in openings. The interfacial layer may be used to improve manufacturing issues in the chemical mechanical polishing process, and the related yield loss may be reduced accordingly.

According to an embodiment of the present invention, a manufacturing method of a connection structure is provided. The manufacturing method includes the following steps. A substrate is provided. Conductive structures are formed on the substrate. A dielectric layer is formed on the conductive structures. Openings are formed in the dielectric layer. Each of the openings is formed above one of the conductive structures and exposes the conductive structure. A tungsten nucleation layer is formed conformally on the dielectric layer and in the openings. A nitrogen-containing treatment is performed on the tungsten nucleation layer. A deposition process is performed to form a tungsten filling layer on the tungsten nucleation layer. An interfacial layer is formed between the tungsten nucleation layer and the tungsten filling layer by the deposition process. A fluorine concentration of the interfacial layer is higher than a fluorine concentration of the tungsten filling layer. A chemical mechanical polishing (CMP) process is performed to remove a part of the tungsten nucleation layer and a part of the tungsten filling layer for forming connection structures in the openings. The interfacial layer is removed by the CMP process.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

FIGS. 1-6 are schematic drawings illustrating a manufacturing method of a connection structure according to a first embodiment of the present invention, wherein FIG. 2 is a schematic drawing in a step subsequent to FIG. 1, FIG. 3 is a schematic drawing in a step subsequent to FIG. 2, FIG. 4 is a schematic drawing in a step subsequent to FIG. 3, FIG. 5 is a schematic drawing in a step subsequent to FIG. 4, and FIG. 6 is a schematic drawing in a step subsequent to FIG. 5.

DETAILED DESCRIPTION

Although specific configurations and arrangements are discussed, it should be understood that this is done for illustrative purposes only. A person skilled in the pertinent art will recognize that other configurations and arrangements can be used without departing from the spirit and scope of the present disclosure. It will be apparent to a person skilled in the related art that the present invention can also be employed in a variety of other applications.

It should be understood that the meaning of "on," "above," and "over" in the present disclosure should be interpreted in the broadest manner such that "on" not only means "directly on" something but also includes the meaning of "on" something with an intermediate feature or a layer therebetween, and that "above" or "over" not only means the meaning of "above" or "over" something but can also include the meaning it is "above" or "over" something with no intermediate feature or layer therebetween (i.e., directly on something).

The term "etch" is used herein to describe the process of patterning a material layer so that at least a portion of the material layer after etching is retained. For example, it is to be understood that the method of etching silicon involves patterning a photoresist layer over silicon and then removing silicon from the area that is not protected by the photoresist layer. Thus, after the etching process is complete, the silicon protected by the area of the photoresist layer will remain. In another example, the term "etch" may also refer to a method that does not use a photoresist, but leaves at least a portion of the material layer after the etch process is completed.

The above description may be used to distinguish between "etching" and "removal". When "etching" a material layer, at least a portion of the material layer is retained after the end of the treatment. In contrast, when the material layer is "removed", substantially all the material layer is removed in the process. However, in some embodiments, "removal" is considered to be a broad term and may include etching.

The term "forming" or the term "disposing" are used hereinafter to describe the behavior of applying a layer of material to the substrate. Such terms are intended to describe any possible layer forming techniques including, but not limited to, thermal growth, sputtering, evaporation, chemical vapor deposition, epitaxial growth, electroplating, and the like.

Figure 1:
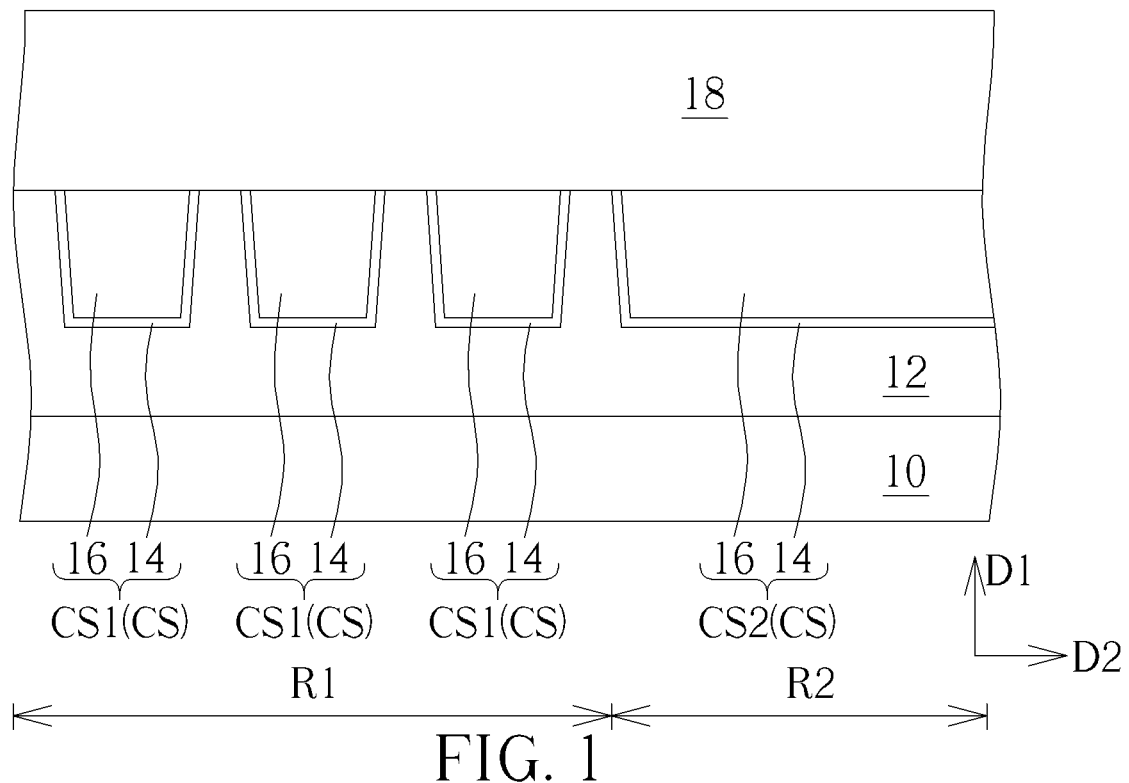
Figure 2:
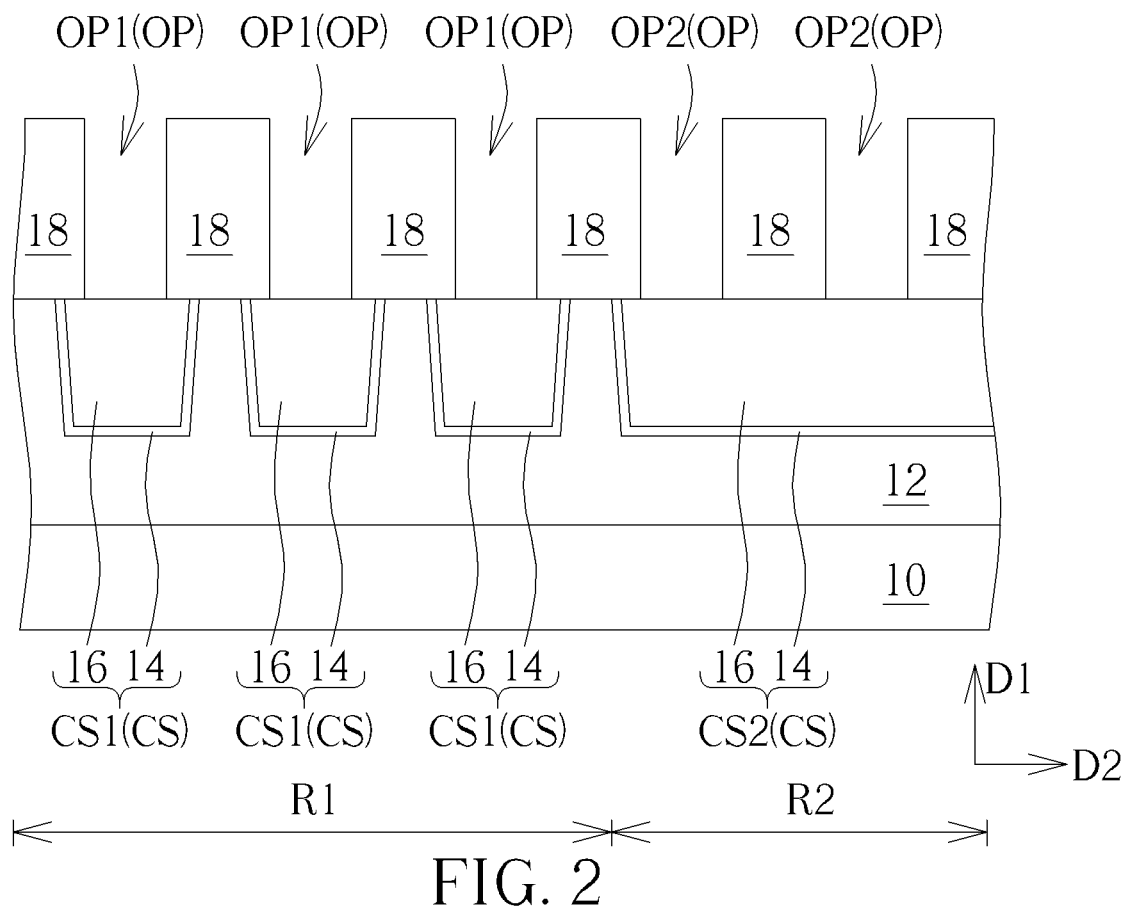
Figure 3:
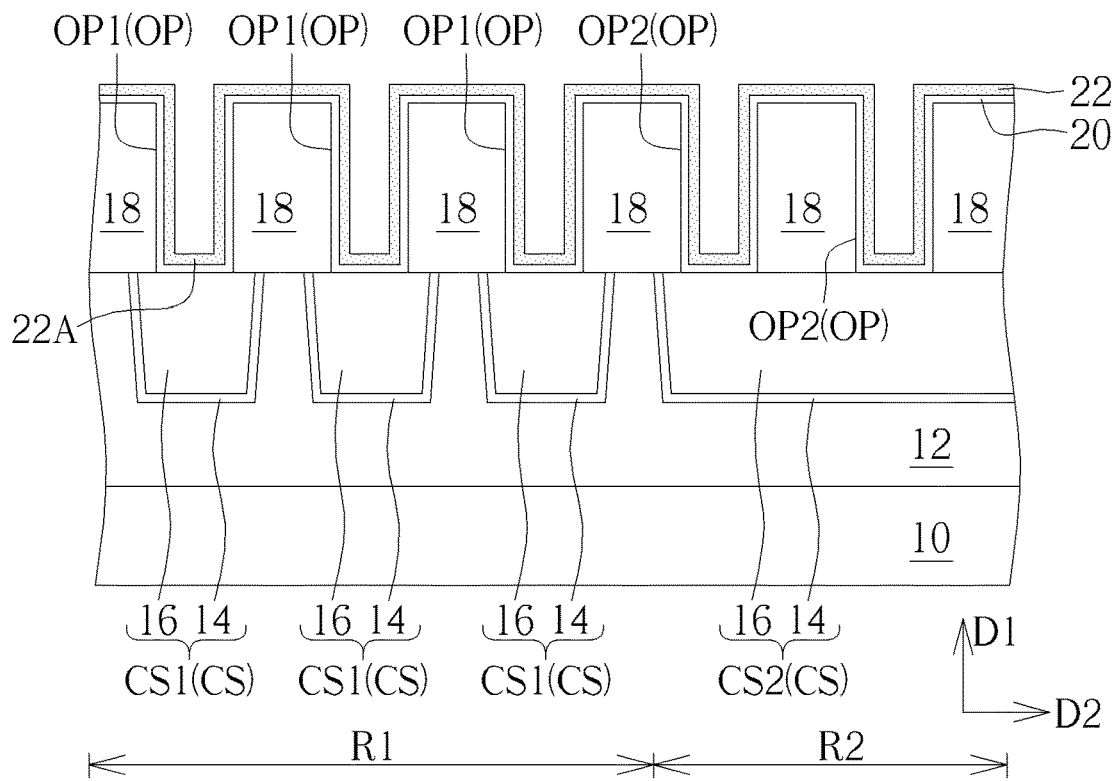
Figure 4:
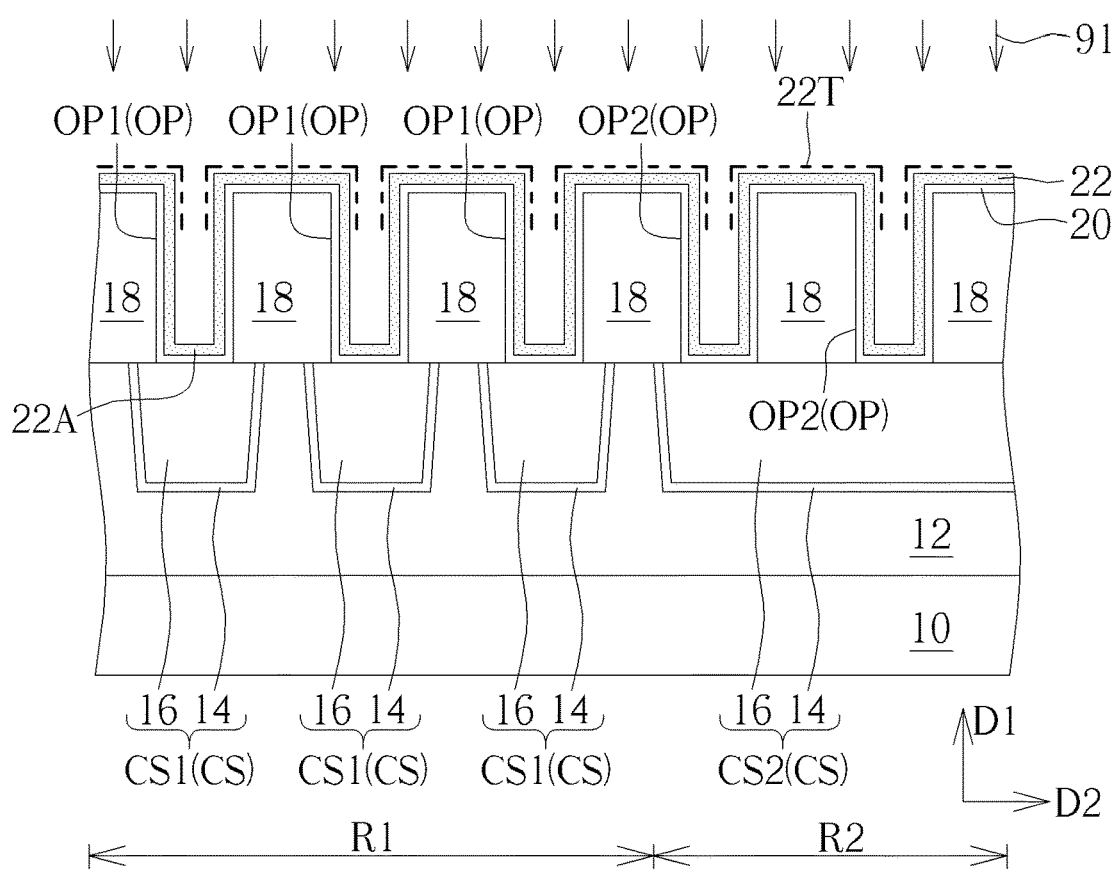
Figure 5:
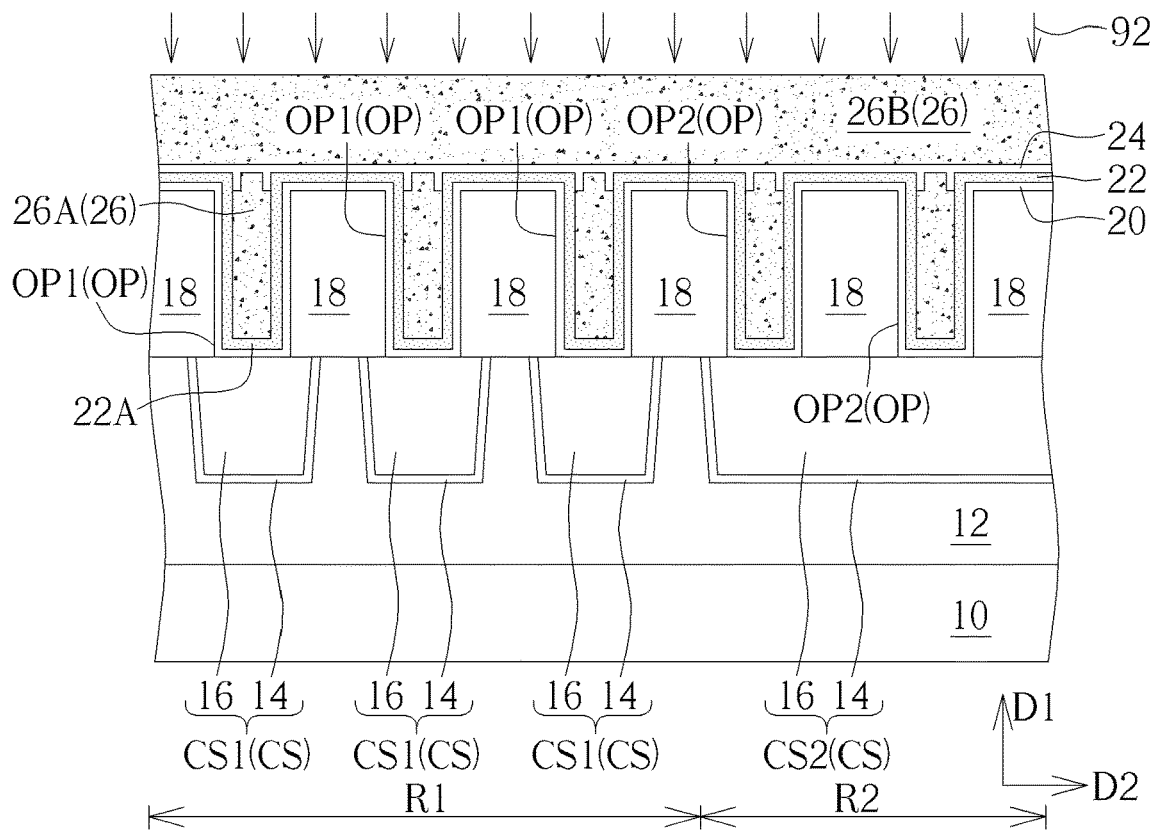
Figure 6:
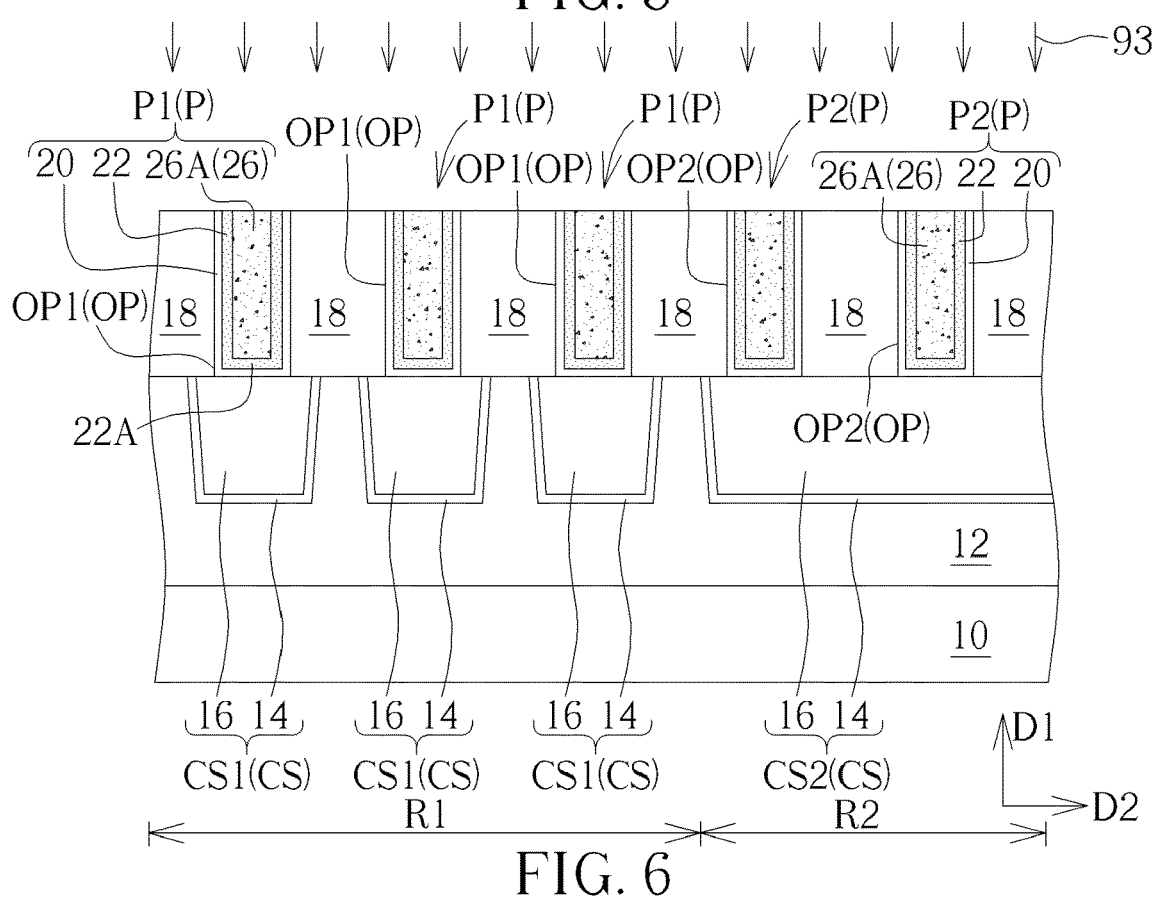
Figure 7:
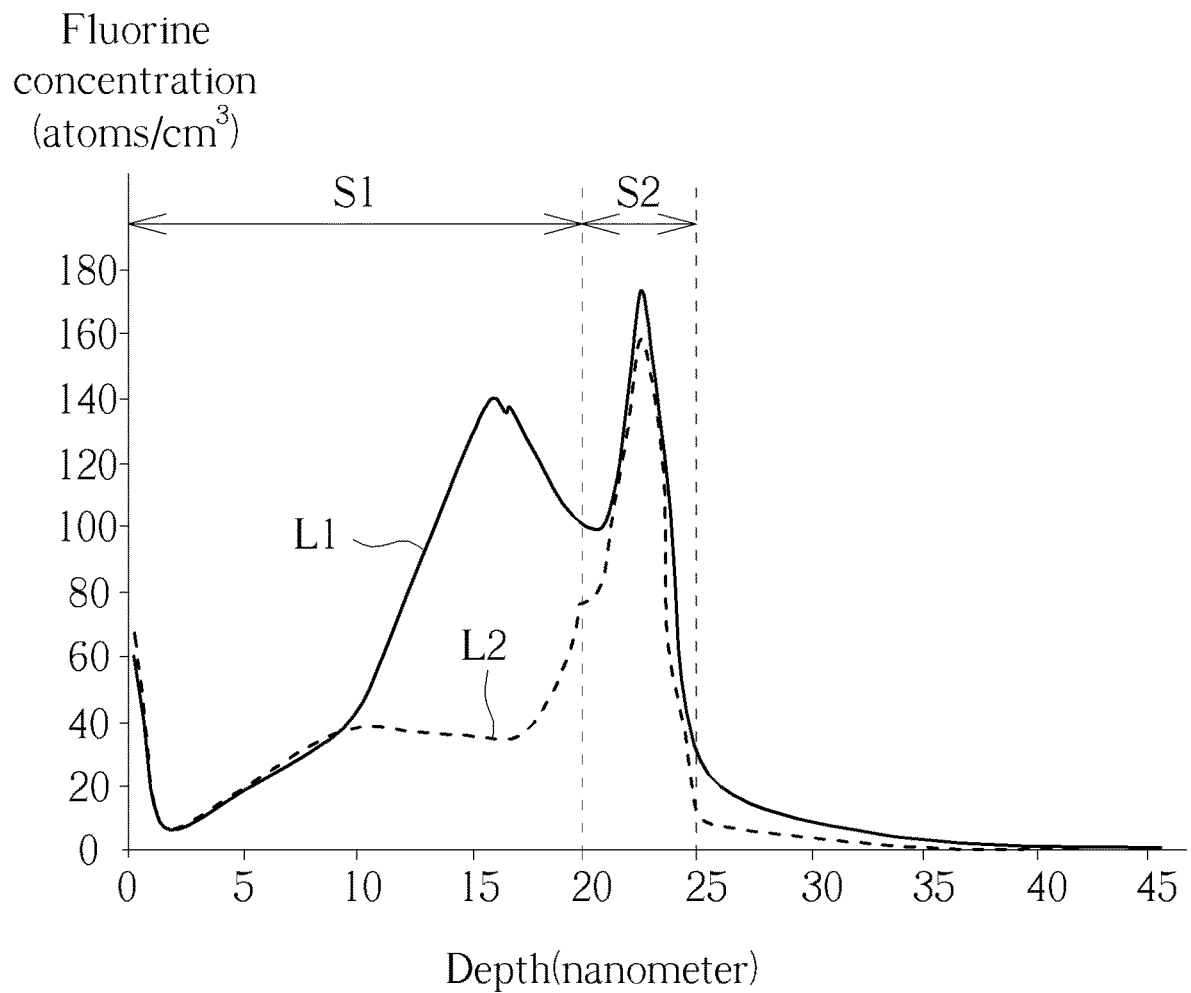
FIG. 7 is a schematic drawing illustrating a comparison between a fluorine concentration distribution of the manufacturing method according to the first embodiment of the present invention and a fluorine concentration distribution of a manufacturing method without a nitrogen-containing treatment.

Please refer to FIGS. 1-7. FIGS. 1-6 are schematic drawings illustrating a manufacturing method of a connection structure according to a first embodiment of the present invention, and FIG. 7 is a schematic drawing illustrating a comparison between a fluorine concentration distribution of the manufacturing method in this embodiment and a fluorine concentration distribution of a manufacturing method without a nitrogen-containing treatment. FIG. 2 is a schematic drawing in a step subsequent to FIG. 1, FIG. 3 is a schematic drawing in a step subsequent to FIG. 2, FIG. 4 is a schematic drawing in a step subsequent to FIG. 3, FIG. 5 is a schematic drawing in a step subsequent to FIG. 4, and FIG. 6 is a schematic drawing in a step subsequent to FIG. 5. The manufacturing method of the connection structure in this embodiment may include the following steps. As shown in FIG. 1, a substrate 10 is provided, and conductive structures CS are formed on the substrate 10. The substrate 10 may include a semiconductor substrate or a non-semiconductor substrate. The semiconductor substrate may include a silicon substrate, a silicon germanium semiconductor substrate or a silicon-on-insulator (SOI) substrate, and the non-semiconductor substrate may include a glass substrate, a plastic substrate, or a ceramic substrate, but not limited thereto. In some embodiments, a first dielectric layer 12 may be formed on the substrate 10 before the step of forming the conductive structures CS, and the conductive structures CS may be formed in the first dielectric layer 12. The first dielectric layer 12 may include a single layer structure or a multiple layer structure of dielectric materials, such as silicon oxide, low dielectric constant (low-k) dielectric materials, or other suitable dielectric materials. The low-k dielectric material described above may include benzocyciclobutene (BCB), hydrogen silsesquioxane (HSQ), methyl silesquioxane (MSQ), hydrogenated silicon oxycarbide (SiOC—H), porous dielectric materials, or other suitable materials having relatively lower dielectric constant. In some embodiments, each of the conductive structures CS may include a first barrier layer 14 and a first conductive material 16, but not limited thereto. The first barrier layer 14 may include titanium (Ti), titanium nitride (TiN), tantalum (Ta), tantalum nitride (TaN), or other suitable barrier materials, and the first conductive material 16 may include tungsten (W), copper (Cu), aluminum (Al), titanium aluminide (TiAl), cobalt tungsten phosphide (CoWP), or other suitable metallic conductive materials. Therefore, each of the conductive structures CS may include a metal conductive structure, but not limited thereto.

In some embodiments, the substrate 10 may have a first region R1 and a second region R2 defined thereon, and the second region R2 may be located adjacent to the first region R1. The conductive structures CS may be formed on the first region R1 and the second region R2. The conductive structure CS formed on the first region R1 may be regarded as a first conductive structure CS1, and the conductive structure CS formed on the second region R2 may be regarded as a second conductive structure CS2. In other words, one of the conductive structures CS may be a first conductive structure CS1 formed on the first region R1, and another one of the conductive structures CS may be a second conductive structure CS2 formed on the second region R2. In some embodiments, the first region R1 may be a memory cell region and the second region R2 may be a peripheral region (such as a logic region), and a volume of the second conductive structure CS2 may be greater than a volume of the first conductive structure CS1, but not limited thereto. In some embodiments, the first region R1 and the second region R2 may be regions for other specific functions and having conductive structures CS with different dimensions. In some embodiment, when the substrate 10 includes a semiconductor substrate, a plurality of silicon-based field effect transistors (not shown) may be formed on the substrate 10 before the step of forming the first dielectric layer 12, and some of the conductive structures CS, such as the second conductive structure CS2, may be electrically connected downward to the silicon-based field effect transistor described above, but not limited thereto.

After the step of forming the conductive structures CS, a second dielectric layer 18 may be formed on the conductive structures CS and the first dielectric layer 12. The second dielectric layer 18 may include silicon oxide, low-k dielectric materials, or other suitable dielectric materials. As shown in FIG. 2, a plurality of openings OP may be formed in the second dielectric layer 18, and each of the openings OP may be formed above one of the conductive structures CS and exposes the conductive structure CS. In other words, each of the openings OP may be formed corresponding to at least one of the conductive structures CS and penetrating the second dielectric layer 18 in a thickness direction of the substrate 10 (such as a first direction D1 shown in FIG. 2) for exposing at least a part of the corresponding conductive structure CS. In some embodiments, the openings OP may be formed by a photolithography process including an etching process, and a part of the conductive structure CS may be etched by the etching process, but not limited thereto. In some embodiments, the opening OP formed corresponding to the first conductive structure CS1 may be regarded as a first opening OP1, the OP formed corresponding to the second conductive structure CS2 may be regarded as a second opening OP2, and there may be two or more second opening OP2 formed corresponding to one second conductive structure CS2 with a volume greater than a volume of the first conductive structure CS1, but not limited thereto.

As shown in FIG. 3, after the step of forming the openings OP, a tungsten nucleation layer 22 may be formed conformally on the second dielectric layer 18 and formed conformally in the openings OP. In other words, the openings OP are not completely filled with the tungsten nucleation layer 22. In some embodiments, a second barrier layer 20 may be formed conformally on the second dielectric layer 18 and conformally formed in the openings OP before the step of forming the tungsten nucleation layer 22, and the tungsten nucleation layer 22 may be formed conformally on the second barrier layer 20, but not limited thereto. The second barrier layer 20 may include a single layer structure or a multiple layer structure of barrier materials, such as titanium, titanium nitride, tantalum, tantalum nitride, or other suitable barrier materials. The tungsten nucleation layer 22 may be formed by a chemical vapor deposition (CVD) process, such as a pulse CVD process, an atomic layer deposition (ALD), or other suitable deposition processes.

As shown in FIG. 4, a nitrogen-containing treatment 91 may be performed on the tungsten nucleation layer 22. In some embodiments, a nitrogen-containing surface 22T may be formed on the tungsten nucleation layer 22 by the nitrogen-containing treatment 91. The nitrogen-containing surface 22T may be formed on the tungsten nucleation layer 22 located outside the openings OP and formed on an upper portion of the tungsten nucleation layer 22 located in each of the openings OP. In other words, the nitrogen-containing surface 22T may not be formed on a bottom portion 24A of the tungsten nucleation layer 22 in the openings OP. In some embodiments, the nitrogen-containing treatment 91 may include a nitrogen radical treatment or other suitable treatments capable of forming the nitrogen-containing surface 22T on the tungsten nucleation layer 22. In some embodiments, some materials, such as ammonia ($NH_3$) and nitrogen gas ($N_2$), may be used as a nitrogen source in the nitrogen-containing treatment 91, but not limited thereto. Additionally, the process conditions of the nitrogen-containing treatment 91 may be modified for keeping the nitrogen-containing surface 22T from being formed on the bottom portion 24A of the tungsten nucleation layer 22 in the openings OP. For example, an inclined nitrogen-containing treatment 91 may be applied to form the nitrogen-containing surface 22T on the tungsten nucleation layer 22 located outside the openings OP and on the upper portion of the tungsten nucleation layer 22 located in the openings OP only, but not limited thereto.

As shown in FIG. 4 and FIG. 5, a deposition process 92 may be subsequently performed to form a tungsten filling layer 26 on the tungsten nucleation layer 22, and an interfacial layer 24 is formed between the tungsten nucleation layer 22 and the tungsten filling layer 26 by the deposition process 92. Each of the openings OP may be filled with the tungsten filling layer 26, the tungsten nucleation layer 22, and the second barrier layer 20. In some embodiments, the interfacial layer 24 may be formed on the nitrogen-containing surface 22T shown in FIG. 4, and a fluorine concentration of the interfacial layer 24 may be higher than a fluorine concentration of the tungsten filling layer 26. In some embodiments, the deposition process 92 may include a chemical vapor deposition process, and tungsten hexafluoride ($WF_6$) may be a process gas used in the chemical vapor deposition process. The nitrogen in the nitrogen-containing surface 22T may be used to increase fluorine concentration in the tungsten material formed by the deposition process 92 because the fluorine atoms tend to replace the nitrogen atoms in the tungsten material, and the interfacial layer 24 having a relatively higher fluorine concentration may be formed on the nitrogen-containing surface 22T and formed between the tungsten nucleation layer 22 and the tungsten filling layer 26 accordingly.

As shown in FIG. 5 and FIG. 7, the fluorine concentration distribution shown in FIG. 7 may be a result of a secondary-ion mass spectrometry (SIMS) analysis and taken along the first direction D1 from the top surface of the tungsten filling layer 26 located above the second dielectric layer 18 to the second dielectric layer 18. A first line L1 in FIG. 7 may be a fluorine concentration distribution of the structure shown in FIG. 5 and formed by the manufacturing method of this embodiment, and a second line L2 in FIG. 7 may be a fluorine concentration distribution of a structure formed by a manufacturing method similar to the manufacturing method of this embodiment except the nitrogen-containing treatment. In other words, the second line L2 in FIG. 7 may be a fluorine concentration distribution of a structure including all components shown in FIG. 5 except the interfacial layer 24. Therefore, the second line L2 within a first section S1 may correspond to a fluorine concentration of a tungsten filling layer, and the second line L2 within a second section S2 may correspond to a fluorine concentration of a tungsten nucleation layer when there is not a nitrogen-containing treatment performed on the tungsten nucleation layer before the deposition process of the tungsten filling layer. Comparatively, the first line L1 within the first section S1 may correspond to the fluorine concentration of the tungsten filling layer 26 and the interfacial layer 24 in this embodiment, and the first line L1 within the second section S2 may correspond to the fluorine concentration of the tungsten nucleation layer 22 in this embodiment. In other words, the relatively higher peak of the first line L1 within the first section S1 may correspond to the fluorine concentration of the interfacial layer 24, and the interfacial layer 24 may include tungsten fluoride, but not limited thereto.

As shown in FIG. 5 and FIG. 6, a chemical mechanical polishing (CMP) process 93 may be subsequently performed to remove a part of the tungsten nucleation layer 22 and a part of the tungsten filling layer 26 for forming connection structures P in the openings OP, and the interfacial layer 24 may be removed by the CMP process 93. Specifically, the second barrier layer 20 formed outside the openings OP, the tungsten nucleation layer 22 formed outside the openings OP, the tungsten filling layer 26 formed outside the openings OP, and the interfacial layer 24 may be removed by the CMP process 93. Each of the connection structures P may include a portion of the second barrier layer 20, a portion of the tungsten nucleation layer 22, and a portion of the tungsten filling layer 26, and each of the connection structures P may be electrically connected with the corresponding conductive structure CS. The connection structure P formed in the first opening OP1 may be regarded as a first connection structure P1, and the connection structure P formed in the second opening OP2 may be regarded as a second connection structure P2. Therefore, one of the connection structures P may be the first connection structure P1 formed on and electrically connected with the first conductive structure CS1, and another one of the connection structures P may be the second connection structure P2 formed on and electrically connected with the second conductive structure CS2. Each of the first connection structure P1 and each of the second connection structure P2 may include a part of the second barrier layer 20, a part of the tungsten nucleation layer 22, and a part of the tungsten filling layer 26 respectively, but not limited thereto.

It is worth noting that the interfacial layer 24 with the relatively higher fluorine concentration may have a relatively lower etching rate in the CMP process because it is more difficult to oxidize the tungsten material having higher fluorine concentration in the CMP process. Therefore, a polishing resistance of the interfacial layer 24 in the CMP process 93 may be higher than a polishing resistance of the tungsten filling layer 26 in the CMP process 93, and an etching rate of the interfacial layer 24 in the CMP process 93 may be lower than an etching rate of the tungsten filling layer 26 in the CMP process 93. Some defects, such as loss of the tungsten nucleation layer 22 in the connection structure P, may be reduced because the polishing behavior of the CMP process 93 may be improved by the interfacial layer 24. In some embodiments, the tungsten nucleation layer 22 in the connection structure P may be corroded by Galvanic effect during the CMP process 93 especially for the connection structure P formed on the metal conductive structure having large volume (such as the second conductive structure CS2) because more electrons may be induced by the conductive structure CS accordingly. The interfacial layer 24 formed by the manufacturing method of the present invention may be used to improve the tungsten nucleation layer loss issue and/or other defects generated by the CMP process 93, and the related yield loss may be reduced accordingly.

As shown in FIG. 4, FIG. 5, and FIG. 6, the nitrogen-containing treatment 91 may be performed before the deposition process 91 in some embodiments. Because of the higher fluorine concentration, the electrical resistivity of the interfacial layer 24 may be higher than the electrical resistivity of the tungsten filling layer 26. For avoiding forming the connection structures P including the interfacial layer 24 having relatively higher electrical resistivity, the interfacial layer 24 may not be formed on the bottom portion 22A of the tungsten nucleation layer 22 in the openings OP, and the interfacial layer 24 is completely removed by the CMP process 93 preferably. Therefore, the tungsten filling layer 26 may directly contact the tungsten nucleation layer 22 in the openings OP, but not limited thereto. In some embodiments, the tungsten filling layer 26 may include a first portion 26A formed in the openings OP and a second portion 26B formed outside the openings OP. In some embodiments, the first portion 26A of the tungsten filling layer 26 may be separated from the second portion 26B of the tungsten filling layer 28 by the interfacial layer 24 before the CMP process 93 especially when the effect of the nitrogen-containing treatment 91 is relatively higher, but not limited thereto. The continuous interfacial layer 24 shown in FIG. 5 may be used to further improve the polishing uniformity of the CMP process 93 shown in FIG. 6, and related defects may be reduced accordingly.

The following description will detail the different embodiments of the present invention. To simplify the description, identical components in each of the following embodiments are marked with identical symbols. For making it easier to understand the differences between the embodiments, the following description will detail the dissimilarities among different embodiments and the identical features will not be redundantly described.

Figure 8:
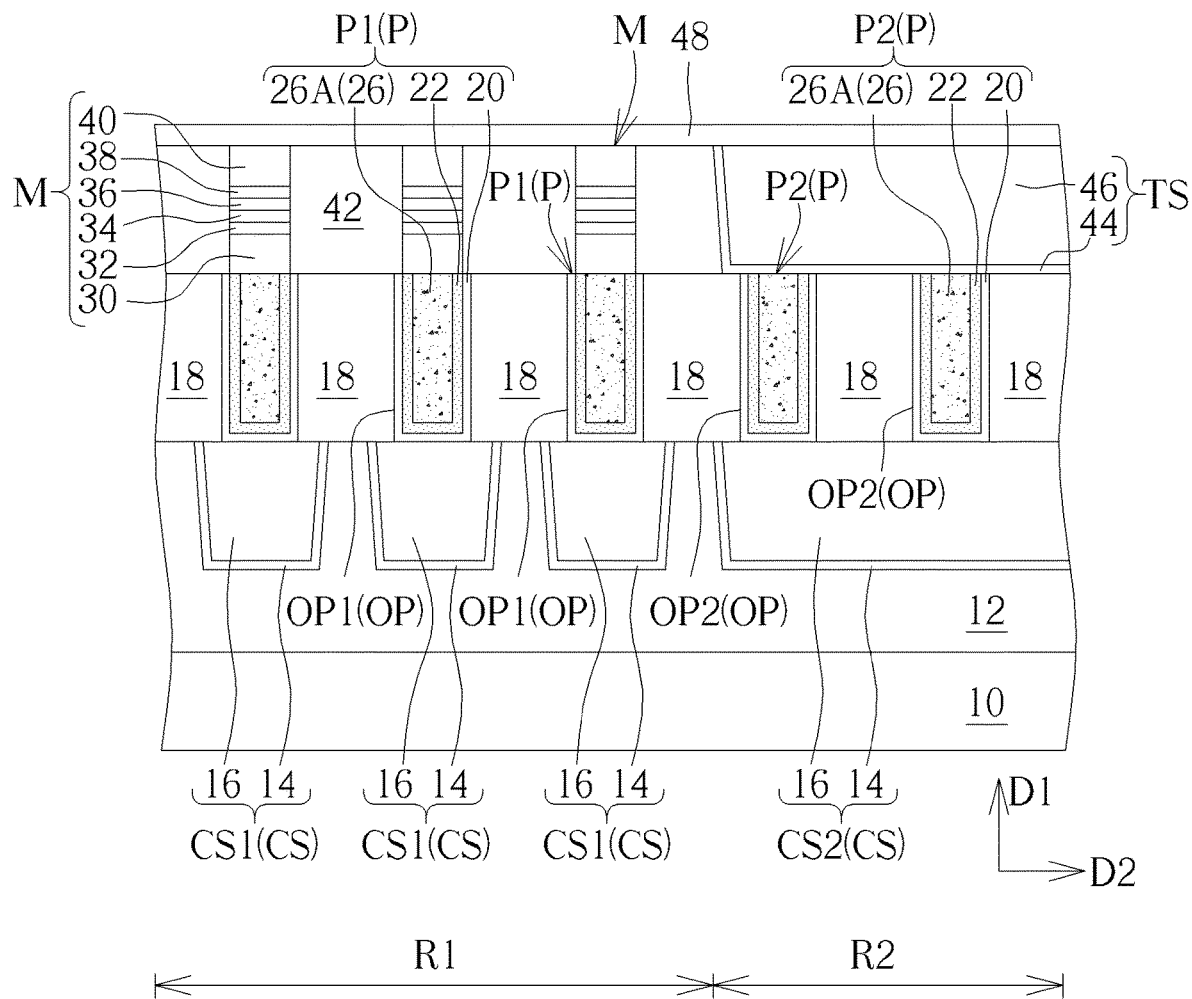
FIG. 8 is a schematic drawing illustrating a manufacturing method of a connection structure according to a second embodiment of the present invention.

Please refer to FIG. 8. FIG. 8 is a schematic drawing illustrating a manufacturing method of a connection structure according to a second embodiment of the present invention. As shown in FIG. 8, the manufacturing method in this embodiment may further include forming a magnetic tunnel junction (MTJ) structure M on the first connection structure P1 and forming an interconnection structure TS on the second connection structure P2. The first conductive structure CS1 on the first region R1 may be electrically connected to the MTJ structure M via the first connection structure P1, and the second conductive structure CS2 on the second region R2 may be electrically connected to the interconnection structure TS via the second connection structure P2, but not limited thereto. In some embodiments, a plurality of MTJ structures M may be formed on the first connection structures P1 respectively, and a third dielectric layer 42 may be formed between the MTJ structures M. The interconnection structure TS may be formed in the third dielectric layer 42, and a fourth dielectric layer 48 may be formed on the MTJ structures M, the interconnection structure TS, and the third dielectric layer 42. The fourth dielectric layer may include silicon oxide, silicon nitride, or other suitable dielectric materials. The third dielectric layer 42 may include a low-k dielectric material for reducing the electrical interference between the adjacent MTJ structures 50 and/or the electrical interference between the MTJ structure 50S and the interconnection structure TS in a horizontal direction (such as a second direction D2 shown in FIG. 8).

In some embodiments, the MTJ structure M may include a bottom electrode 30, a pinned layer 32, a first barrier film 34, a free layer 36, a second barrier film 38, and a top electrode 40 sequentially stacked in the first direction D1. In some embodiments, the MTJ structure M may include a stacked structure different from the materials layers described above and/or include other material layers. In some embodiments, the bottom electrode 30 and the top electrode 40 may include metallic materials, such as tantalum, platinum, ruthenium, a stack layer of the above-mentioned materials, an alloy of the above-mentioned materials, or other suitable conductive materials. The pinned layer 32 may include an antiferromagnetic layer and a reference layer. The antiferromagnetic layer may include antiferromagnetic materials such as iron manganese (FeMn), platinum manganese (PtMn), iridium manganese (IrMn), nickel oxide (NiO), a cobalt/platinum (Co/Pt) multilayer, or other suitable antiferromagnetic materials. The free layer 36 and the reference layer in the pinned layer 32 may include ferromagnetic materials such as iron, cobalt, nickel, cobalt-iron (CoFe), cobalt-iron-boron (CoFeB), or other suitable ferromagnetic materials. The first barrier film 34 and the second barrier film 38 may include insulation materials such as magnesium oxide (MgO), aluminum oxide, or other suitable insulation materials. The above-mentioned material layers in the MTJ structure M may be formed by deposition processes, such as sputtering processes, but not limited thereto. In some embodiments, the interconnection structure TS may include a third barrier layer 44 and a second conductive material 46, but not limited thereto. The third barrier layer 44 may include titanium, titanium nitride, tantalum, tantalum nitride TaN, or other suitable barrier materials, and the second conductive material 46 may include tungsten, copper, aluminum, titanium aluminide, cobalt tungsten phosphide, or other suitable metallic conductive materials. It is worth noting that the present invention is not limited to the condition shown in FIG. 8, and other suitable components may be formed on and electrically connected to the first connection structure P1 and/or the second connection structure P2.

Figure 9:
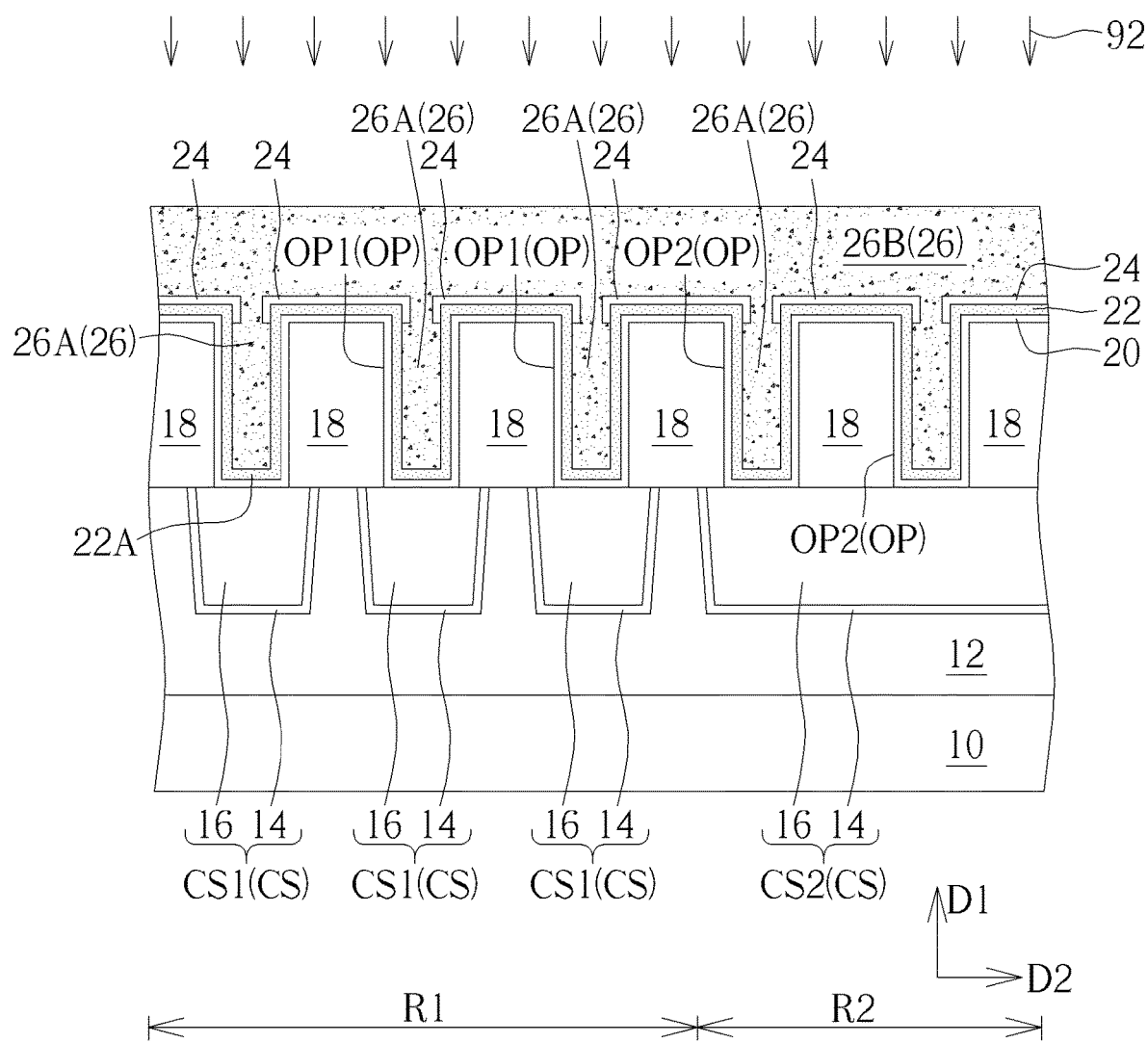
FIG. 9 is a schematic drawing illustrating a manufacturing method of a connection structure according to a third embodiment of the present invention.

Please refer to FIG. 9 and FIG. 6. FIG. 9 is a schematic drawing illustrating a manufacturing method of a connection structure according to a third embodiment of the present invention, and FIG. 6 may be regarded as a schematic drawing in a step subsequent to FIG. 9. As shown in FIG. 9 and FIG. 6, in the manufacturing method of this embodiment, the first portion 26A of the tungsten filling layer 26 may be directly connected with the second portion 26B of the tungsten filling layer 26 after the deposition process 92. In other words, the interfacial layer 24 may include portions separated from one another. The process time of the CMP process 93 may be reduced because of the relatively smaller interfacial layer 24 in this embodiment.

To summarize the above descriptions, in the manufacturing method of the connection structure according to the present invention, the nitrogen-containing treatment may be applied to form the interfacial layer between the tungsten nucleation layer and the tungsten filling layer in the deposition process of the tungsten filling layer. The polishing behavior of the CMP process for forming the connection structure may be improved by the interfacial layer having relatively higher fluorine concentration. The related defects generated by the CMP process may be improved, and the yield loss of the manufacturing method may be reduced accordingly.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A manufacturing method of a connection structure, comprising:
    providing a substrate;
    forming conductive structures on the substrate;
    forming a dielectric layer on the conductive structures;
    forming openings in the dielectric layer, wherein each of the openings is formed above one of the conductive structures and exposes the conductive structure;
    forming a tungsten nucleation layer conformally on the dielectric layer and in the openings;
    performing a nitrogen-containing treatment on the tungsten nucleation layer, wherein the nitrogen-containing treatment is performed by adding ammonia ($NH_3$) and nitrogen gas ($N_2$) as a nitrogen source;
    performing a deposition process to form a tungsten filling layer on the tungsten nucleation layer, wherein an interfacial layer is formed between the tungsten nucleation layer and the tungsten filling layer by the deposition process, and a fluorine concentration of the interfacial layer is higher than a fluorine concentration of the tungsten filling layer, wherein the interfacial layer comprises tungsten fluoride; and
    performing a chemical mechanical polishing (CMP) process to remove a part of the tungsten nucleation layer and a part of the tungsten filling layer for forming connection structures in the openings, wherein the interfacial layer is removed by the CMP process.

2. The manufacturing method of the connection structure according to claim 1, wherein the interfacial layer is completely removed by the CMP process.

3. The manufacturing method of the connection structure according to claim 1, wherein the nitrogen-containing treatment is performed before the deposition process.

4. The manufacturing method of the connection structure according to claim 1, wherein the nitrogen-containing treatment comprises a nitrogen radical treatment.

5. The manufacturing method of the connection structure according to claim 1, wherein a nitrogen-containing surface is formed on the tungsten nucleation layer by the nitrogen-containing treatment, and the interfacial layer is formed on the nitrogen-containing surface.

6. The manufacturing method of the connection structure according to claim 5, wherein the nitrogen-containing surface is not formed on a bottom portion of the tungsten nucleation layer in the openings.

7. The manufacturing method of the connection structure according to claim 1, wherein the interfacial layer is not formed on a bottom portion of the tungsten nucleation layer in the openings.

8. The manufacturing method of the connection structure according to claim 1, wherein the tungsten filling layer directly contacts the tungsten nucleation layer in the openings.

9. The manufacturing method of the connection structure according to claim 1, wherein the tungsten filling layer comprises:
    a first portion formed in the openings; and
    a second portion formed outside the openings.

10. The manufacturing method of the connection structure according to claim 9, wherein the first portion of the tungsten filling layer is separated from the second portion of the tungsten filling layer by the interfacial layer.

11. The manufacturing method of the connection structure according to claim 9, wherein the first portion of the tungsten filling layer is connected with the second portion of the tungsten filling layer.

12. The manufacturing method of the connection structure according to claim 1, wherein a polishing resistance of the interfacial layer in the CMP process is higher than a polishing resistance of the tungsten filling layer in the CMP process.

13. The manufacturing method of the connection structure according to claim 1, wherein each of the connection structures comprises a portion of the tungsten nucleation layer and a portion of the tungsten filling layer, and each of the connection structures is electrically connected with the corresponding conductive structure.

14. The manufacturing method of the connection structure according to claim 1, further comprising:
    forming a barrier layer conformally on the dielectric layer and in the openings before the step of forming the tungsten nucleation layer, wherein the tungsten nucleation layer is formed on the barrier layer, and a part of the barrier layer is removed by the CMP process.

15. The manufacturing method of the connection structure according to claim 1, wherein the substrate has a first region and a second region adjacent to the first region, one of the conductive structures is a first conductive structure formed on the first region, and another one of the conductive structures is a second conductive structure formed on the second region, wherein a volume of the second conductive structure is greater than a volume of the first conductive structure.

16. The manufacturing method of the connection structure according to claim 15, wherein one of the connection structures is a first connection structure formed on and electrically connected with the first conductive structure, and another one of the connection structures is a second connection structure formed on and electrically connected with the second conductive structure.

17. The manufacturing method of the connection structure according to claim 16, further comprising:
    forming a magnetic tunnel junction (MTJ) structure on the first connection structure, wherein the first conductive structure is electrically connected to the MTJ structure via the first connection structure.

18. The manufacturing method of the connection structure according to claim 16, further comprising:
    forming an interconnection structure on the second connection structure, wherein the second conductive structure is electrically connected to the interconnection structure via the second connection structure.

19. The manufacturing method of the connection structure according to claim 1, wherein each of the conductive structures comprises a metal conductive structure.

* * * * *